United States Patent [19]
Gregor et al.

[11] Patent Number: 5,843,827
[45] Date of Patent: Dec. 1, 1998

[54] METHOD OF REDUCING DIELECTRIC DAMAGE FROM PLASMA ETCH CHARGING

[75] Inventors: Richard William Gregor, Winter Park, Fla.; Chung Wai Leung, Orlando, Fla.

[73] Assignee: Lucent Technologies Inc., Murray Hill, N.J.

[21] Appl. No.: 724,128

[22] Filed: Sep. 30, 1996

[51] Int. Cl.⁶ ............................................... H01L 21/336
[52] U.S. Cl. .................... 438/301; 438/306; 438/585; 438/586; 438/589
[58] Field of Search .................. 438/585, 586, 438/589, 301, 306

[56] References Cited

U.S. PATENT DOCUMENTS

| | | | |
|---|---|---|---|
| 3,739,237 | 6/1973 | Shannon | 438/301 |
| 4,441,249 | 4/1984 | Alspector et al. | |
| 5,272,099 | 12/1993 | Chou et al. | 438/586 |
| 5,328,867 | 7/1994 | Chien et al. | 438/301 |
| 5,464,792 | 11/1995 | Tseng et al. | 438/585 |
| 5,576,242 | 11/1996 | Liu | 438/586 |
| 5,580,806 | 12/1996 | Chang et al. | 438/586 |
| 5,654,231 | 8/1997 | Liang et al. | 438/586 |
| 5,681,778 | 10/1997 | Manning | 438/586 |

*Primary Examiner*—John Niebling
*Assistant Examiner*—Lynne A. Gurley
*Attorney, Agent, or Firm*—Scott W. MacLellan

[57] ABSTRACT

A method of suppressing damage to gate dielectrics by reducing the electrical field across the gate dielectric during plasma etching, photoresist stripping, or plasma assisted deposition of the overlying conductor to be etched. Openings in the gate oxide in the vicinity of the gates to be formed place the two conductive layers in contact with each other before the gates are formed and allows for the underlying conductive layer (usually the substrate) to be exposed to the plasma as the overlying unmasked conductive layer (usually polysilicon) is etched away. Preferably, the layer to be etched is deposited to be in contact with the underlying layer at the openings. This technique is applicable to integrated capacitor structures and other susceptible structures with a dielectric layer between two conductors.

6 Claims, 2 Drawing Sheets

METHOD OF REDUCING DIELECTRIC DAMAGE FROM PLASMA ETCH CHARGING

CROSS-REFERENCE TO RELATED APPLICATION

This application is related to co-pending application Ser. No. 08/724,130, titled "Method of Reducing Dielectric Damage from Plasma Etch Charging," having the same inventors and assigned to the same assignee as this application, and is incorporated herein by reference.

BACKGROUND OF THE INVENTION

1. Field of the Invention

This invention relates to integrated circuit manufacturing in general and, more particularly, to fabricating MOS transistors on an integrated circuit.

2. Description of the Prior Art

Integrated circuit manufacturers are going to smaller gate lengths with lower power supply voltages to achieve greater density and faster clock speeds without significant increases in power dissipation.

One technique manufacturers are using to allow low voltage (e.g., 3 volt) operation is gate oxide thinning. Generally, the thinner the gate oxide, the lower the voltage necessary for the MOS transistor to operate. However, the thin gate oxide is easily damaged by excessive voltages applied to the gate above the oxide. While electrostatic discharge from external sources (such as handling the chip without proper grounding) is widely recognized as one contributor to gate oxide damage, it has been discovered that gate oxide damage may occur from the manufacturing process itself, even with relatively thick oxides of approximately 15 nm. In particular and referring to FIGS. 5 and 6, anisotropic plasma etching (also known as reactive ion etch or RIE where energetic ions and neutrals strike what is being etched to cause a chemical reaction therewith and, incidentally, deposit charge thereon) of a polysilicon layer 36 (masked by patterned photoresist 37) over gate oxide 34 to form a transistor gate 38 has been found to create gate oxide damage by, it is believed, the plasma charging the conductive polysilicon 36 being etched with respect to the underlying conductive layer (substrate) 31 or a later step of stripping photoresist 37 with a plasma (sometimes referred to as ashing). Once the polysilicon becomes separated into the desired gate conductors 38, the gates may become sufficiently charged by the plasma to cause breakdown of the underlying oxide 34. The results of such breakdowns may be immediately noticeable, such as a conductive path between the gate and the underlying substrate. More nefarious results are those that are not immediately noticeable but impact the reliability of the transistor. For example, carriers may be trapped in the oxide, making the transistor more susceptible to hot carrier damage.

One technique for reducing damage is to reduce the plasma power density and, if it is available, turning off a magnetic field on the plasma etcher. However, this has the effect of reducing the uniformity of the etch across the wafer being etched, increases the isotropicity of the etch, and reduces the selectivity and efficiency of the etch.

Therefore, it is desirable to provide a method of making transistor gates in a way that suppresses oxide damage without changing the advantages of ideal anisotropic plasma etching.

SUMMARY OF THE INVENTION

This and other aspects of the invention may be obtained generally by including the following steps in making an integrated circuit. First, a dielectric layer is formed over a first conductive layer and openings formed therein to expose portions of the first conductive layer. Next, a second conductive layer is deposited over the dielectric layer and into the openings. The second layer is then masked and plasma etched to form conductors.

During the etching of the second conductive layer, the second conductive layer and the underlying first conductive layer are, preferably, initially in contact with each other and, as the second conductive layer is being etched away, both layers are exposed to the plasma. This allows for reduction in the voltage difference between the first and second conductive layers during the etch, reducing the chance of dielectric breakdown between the conductive layers.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
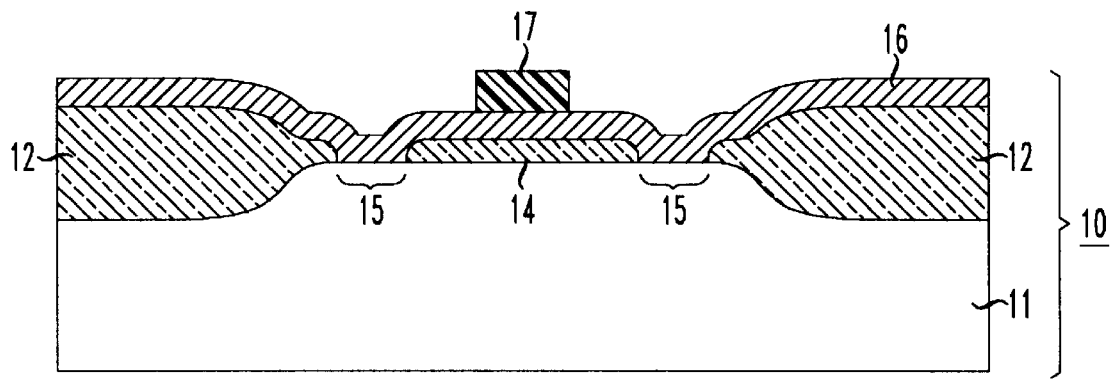
FIG. 1 is an exemplary transistor structure (not to scale) during the manufacture thereof according to one embodiment of the invention.
Figure 2:
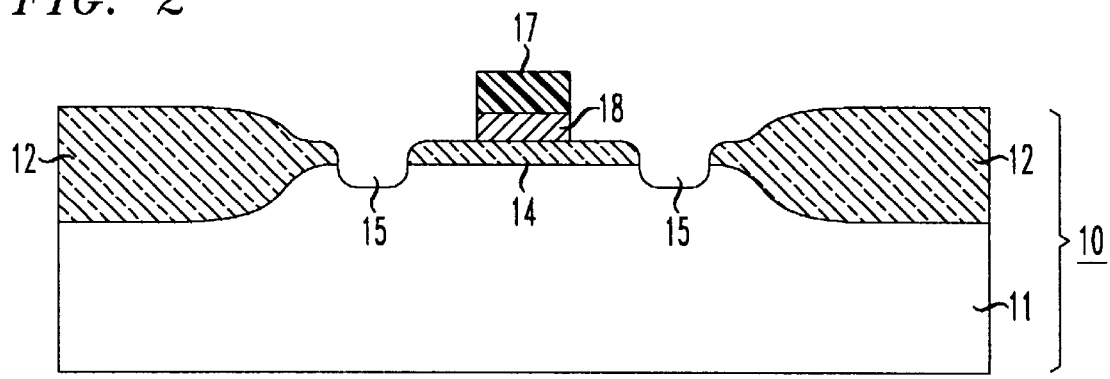
FIG. 2 is the structure of FIG. 1 after gate definition.

Generally, the invention may be understood by referring to FIG. 1. As discussed below in more detail and in accordance with one embodiment of the invention, part of a wafer 10 will have fabricated thereon at least one transistor (not numbered). A first conductive layer 11 (here a semiconductor substrate) has thereon a dielectric 14 with openings 15 therein, exposing the conductor 11. A second conductive layer 16 is deposited over the dielectric layer 14 and into the openings 15. The second layer 16 is then masked by resist 17 and plasma etched to form conductors 18 as shown in FIG. 2.

In more detail, the wafer 10 has a substrate 11, on which conventional field oxides (FOX) 12 and gate oxide layer 14 are formed. Field oxides 12 are generally much thicker than the gate oxide layer 14. The area (not numbered) on the substrate 11 between the FOX regions 12 is where transistors, resistors, capacitors, etc. are generally formed. Typically, gate oxide layer 14 is less than 20 nm thick and, in more aggressive technologies, as thin as 3 nm. The oxide layers 12 and 14 are masked (not shown) to allow openings 15 to be formed in the oxide layer 14. These openings expose the underlying substrate 11. The size and shape and position of the openings 15 are not believed to be critical but should be of sufficient size (in proportion to the area of the resulting transistor gates) and close to where the gates are to be formed, as discussed below. The openings may be made with any conventional etching techniques, such as wet (HF) etching or conventional plasma etching.

Next, a layer of polysilicon 16 is deposited, which is typically doped, either in situ, by furnace diffusion or by implant. Then a photoresist is deposited and patterned to define a mask 17, below which the polysilicon 16 will remain as the transistor gate. This structure is then exposed to a conventional plasma etch which removes the unmasked portions of polysilicon layer 16, resulting generally in the polysilicon region 18 as shown in structure of FIG. 2.

The remaining polysilicon 18 is, for purposes here, the gate for a transistor to be completed in a conventional manor (implanting for source and drain with optional lightly doped drain formation, resist stripping, silicide formation, inter-level dielectric deposition, window formation, contacting the source and drain, and further metal deposition, etc.). Note that during overetching of the polysilicon, small depressions in the substrate 11 in the vicinity of the openings 15 may occur. This is generally not considered harmful.

The presence of openings 15 during etching desirably allows (1) the polysilicon layer 16 to contact the substrate 11 before the polysilicon is separated into individual gates and (2) allows the plasma to contact the substrate 11 as the individual gates are formed. This, it is believed, reduces the difference in electrical potential on the polysilicon gate 18 with respect to the substrate 11 during etching. Further, during the stripping of the photoresist 17 in an oxygen plasma (ashing the resist), both the substrate 11 and the gate 18 are exposed to the plasma, reducing the difference in electrical potential therebetween. With a reduced electrical field across the gate oxide 14, the less the chance that the oxide will breakdown and/or charges are trapped in the oxide 14.

To reduce the electrical potential as low as practical, the openings 15 should be in the vicinity of the gate 18 and may be advantageously co-located with the later formed source and drain contact windows (not shown). By using the same reticle for the openings 15 as well as the source and drain contact windows, the openings are adjacent to the gates and no extra reticles are needed. However, it is understood that the openings 15 can be located remotely from the active area of the transistors, such as in the scribe area between circuits on a common wafer (not shown).

It is understood that prior to the source and drain implants, a thin oxide layer may be formed (by oxidation or deposition) over openings 15.

Figure 3:
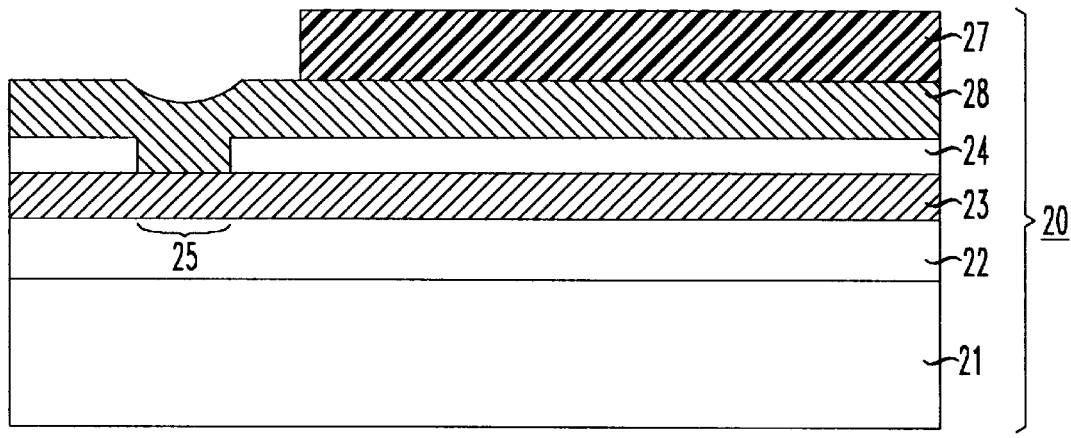
FIG. 3 is an exemplary capacitor structure (not to scale) during the manufacturer thereof according to a different embodiment of the invention.
Figure 4:
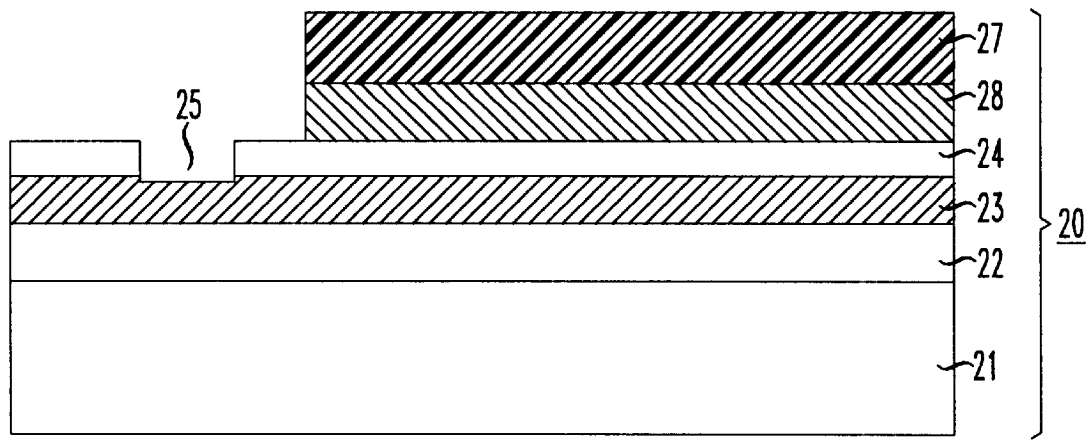
FIG. 4 is the structure of FIG. 3 after etching.
Figure 5:
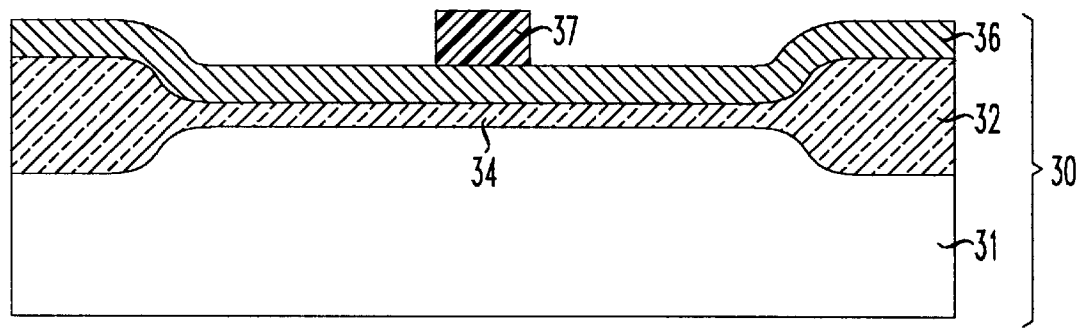
FIG. 5 is an exemplary prior art transistor structure (not to scale) prior to gate definition.
Figure 6:
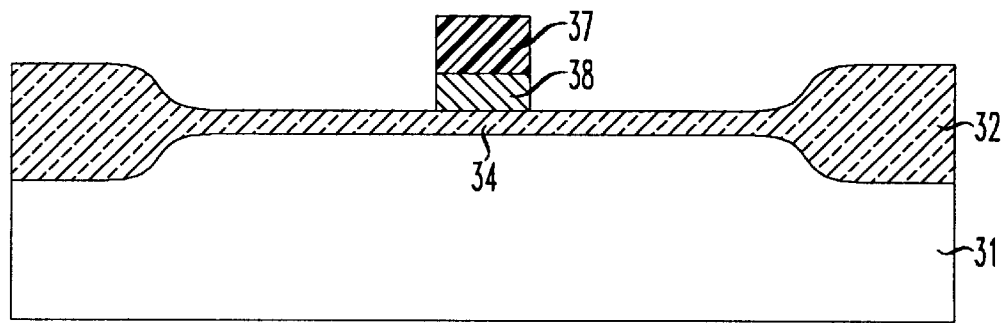
FIG. 6 is the structure of FIG. 5 after gate definition.

In FIGS. 3 and 4 an alternative exemplary embodiment of the invention is shown. These figures show some steps in an exemplary fabrication process of an inter-metal or inter-polysilicon layer integrated capacitor (not numbered), useful in various circuit applications, such as in analog circuits and as DRAM storage capacitors. The technique is similar to that discussed in connection with FIGS. 1 and 2. Briefly, the capacitor has two plates, a bottom plate of, for example, a polysilicon 23 and a top plate of, for example, polysilicon 26. Between the plates 23, 26 is a dielectric layer 24, typically an oxide (grown from polysilicon layer 23 or deposited or a combination thereof). Generally, the thinner the dielectric layer 24, the higher the capacitance of the resulting capacitor. Therefore, the thickness of the layer 24 may be as thin as a gate oxide and subject to the same problems discussed above.

To address the oxide breakdown problem, an opening 25 (FIG. 4) is formed in the dielectric layer 24 such that layers 23 and 26 (both typically polysilicon) are in contact. When conductive layer 26 is etched (masked by patterned photoresist mask 27), the layer 23 will be eventually exposed to the plasma. This reduces the electrical potential on layer 26 with respect to layer 23 during the etch. Further, it is recognized that if the deposition of layer 26 is plasma assisted, then the opening 25 will assist in reducing the potential between layer 23 and the deposited layer 26 during the deposition.

While the bottom layer 23 is shown insulated from substrate 21 by dielectric layer 22, it is understood that substrate 21 can be one plate of the capacitor and layer 23 the top plate. In this case, the opening 25 is made in dielectric layer 22.

While the devices and layers shown are exemplary, other topologies may be used to achieve the same results. For example, other sensitive structures, such as in bipolar transistor fabrication, may also take advantage of this technique. Further, other kinds of insulating layers and conductive layers may be substituted for those disclosed herein.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

We claim:

1. A method of making an integrated circuit, comprising the steps of:

forming a gate dielectric layer over a conductive substrate;

forming openings in the gate dielectric layer to expose portions of the substrate;

depositing a conductive silicon layer over the dielectric layer to be in electrical contact with the substrate in the openings;

masking and plasma etching the conductive silicon layer to form transistor gates, said openings being adjacent to the transistor gates;

selectively implanting dopant into the substrate to form source and drain regions aligned with the gates;

forming windows in the gate oxide substantially co-located with the openings to expose the source and drain regions and contacting the source and drain regions;

whereby said conductive silicon layer being in electrical contact with the substrate in the opening reduces any voltage potential and the chance of dielectric breakdown between the conductive silicon layer and the substrate during the plasma etching of the conductive silicon layer.

2. The method as recited in claim 1, wherein the gate dielectric layer is gate oxide and the conductive silicon layer is polysilicon.

3. The method as recited in claim 2, further comprising the step of:

forming a protective oxide over the exposed portions of the substrate;

wherein the windows are additionally formed in the protective oxide.

4. The method as recited in claim 2, wherein the polysilicon is in situ doped polysilicon.

5. The method as recited in claim 4, further comprising the step of: siliciding the doped polysilicon.

6. The method as recited in claim 1, wherein the conductive silicon layer is masked with a photoresist, and further comprising the step of:

stripping the mask from the substrate using a plasma.

* * * * *